(12) United States Patent
Choi et al.

(10) Patent No.: US 11,699,676 B2
(45) Date of Patent: Jul. 11, 2023

(54) MULTI-BEAM LASER DE-BONDING APPARATUS AND METHOD THEREOF

(71) Applicant: LASERSSEL CO., LTD., Asan-si (KR)

(72) Inventors: Jae-Joon Choi, Gwangju-si (KR); Nam-Seong Kim, Anyang-si (KR); Byung-Roc Kim, Incheon (KR); Jong-Jae Yoo, Asan-si (KR); Boo-Seong Park, Asan-si (KR)

(73) Assignee: LASERSSEL CO., LTD., Asan-si (KR)

( * ) Notice: Subject to any disclaimer, the term of this patent is extended or adjusted under 35 U.S.C. 154(b) by 896 days.

(21) Appl. No.: 16/596,925

(22) Filed: Oct. 9, 2019

(65) Prior Publication Data
US 2020/0251442 A1   Aug. 6, 2020

(30) Foreign Application Priority Data

Feb. 1, 2019   (KR) .......................... 10-2019-0013549

(51) Int. Cl.
*H01L 23/00* (2006.01)
*B23K 26/06* (2014.01)
*B23K 26/354* (2014.01)

(52) U.S. Cl.
CPC ........ *H01L 24/799* (2013.01); *B23K 26/0608* (2013.01); *B23K 26/354* (2015.10);
(Continued)

(58) Field of Classification Search
CPC ............ B23K 26/0676; B23K 26/0608; B23K 26/354; H01L 2924/40105; H01L 24/799; H01L 2224/7999
(Continued)

(56) References Cited

U.S. PATENT DOCUMENTS 4,877,175 A * 10/1989 Jones .................. H01L 23/5258
228/264
6,119,919 A *  9/2000 Kasulke ................ B23K 1/018
228/19
(Continued)

FOREIGN PATENT DOCUMENTS

JP   S58-159514 A     9/1983
JP   2004-314165 A    11/2004
(Continued)

OTHER PUBLICATIONS

Office Action issued for corresponding Korean Patent Application No. 10-2019-0013549 dated May 11, 2020.
(Continued)

*Primary Examiner* — Jimmy Chou
(74) *Attorney, Agent, or Firm* — Hauptman Ham, LLP (57) ABSTRACT

Provided is a multi-beam laser debonding apparatus for debonding an electronic component from a substrate, the apparatus including: a first laser module to emit a first laser beam to a predetermined range of a first substrate area including attachment positions of a debonding target electronic component and a neighboring electronic component to thereby heat a solder of the electronic components to reach a predetermined pre-heat temperature; and a second laser module to emit a second laser beam overlapping the first laser beam to a second substrate area smaller than the first substrate area, the second substrate area including the attachment position of the debonding target electronic component to thereby heat the solder of the debonding target electronic component to reach a debonding temperature at which the solder commences melting.

7 Claims, 10 Drawing Sheets

(52) U.S. Cl.
CPC ............... *H01L 2224/7999* (2013.01); *H01L 2924/40105* (2013.01)

(58) Field of Classification Search
USPC ............ 219/121.63, 121.64, 121.65, 121.68, 219/121.69, 121.82
See application file for complete search history.

(56) References Cited

U.S. PATENT DOCUMENTS

| | | | | |
|---|---|---|---|---|
| 6,600,171 | B1* | 7/2003 | Farnworth | H01L 24/12 324/750.16 |
| 6,657,159 | B2* | 12/2003 | McKee | B23K 26/389 219/121.71 |
| 7,021,517 | B2* | 4/2006 | Zakel | H01L 21/67144 228/43 |
| 7,423,237 | B2* | 9/2008 | Kusama | C03B 33/076 219/121.72 |
| 7,753,251 | B2* | 7/2010 | Yamamoto | H05K 3/303 228/264 |
| 7,829,817 | B2* | 11/2010 | Zakel | B23K 1/018 228/264 |
| 8,087,163 | B2* | 1/2012 | Azdasht | H01L 24/75 219/121.64 |
| 8,330,076 | B2* | 12/2012 | Azdasht | B23K 1/018 228/264 |
| 8,835,800 | B2* | 9/2014 | Tanaka | H01L 27/1214 438/149 |
| 8,986,497 | B2* | 3/2015 | Sercel | B23K 26/40 156/930 |
| 8,998,068 | B2* | 4/2015 | Park | H01L 24/799 228/19 |
| 10,160,053 | B1* | 12/2018 | Kusnierek | B23K 3/0607 |
| 10,224,229 | B2* | 3/2019 | Andry | H01L 21/6835 |
| 10,297,479 | B2* | 5/2019 | Dang | B23K 26/36 |
| 10,654,132 | B2* | 5/2020 | Matsumoto | B23K 26/0884 |
| 10,693,070 | B2* | 6/2020 | Suga | B32B 43/006 |
| 11,247,285 | B1* | 2/2022 | Collins | B65G 47/1457 |
| 11,276,665 | B2* | 3/2022 | Kim | H01L 22/26 |
| 2002/0146893 | A1* | 10/2002 | Shimoda | G02F 1/1368 257/E27.111 |
| 2003/0006221 | A1* | 1/2003 | Hong | H01L 21/3043 219/121.72 |
| 2003/0080099 | A1* | 5/2003 | Tanaka | H01L 21/02592 219/121.76 |
| 2003/0153182 | A1* | 8/2003 | Yamazaki | H01L 21/76894 438/689 |
| 2004/0124227 | A1* | 7/2004 | Seki | H04N 5/35518 228/103 |
| 2004/0198028 | A1* | 10/2004 | Tanaka | H01L 21/2026 219/121.76 |
| 2005/0115937 | A1* | 6/2005 | Gu | B23K 26/04 219/121.68 |
| 2005/0239270 | A1* | 10/2005 | Fehrer | C30B 29/403 257/E21.567 |
| 2005/0282357 | A1* | 12/2005 | Takayama | H01L 27/1266 257/E27.111 |
| 2006/0021681 | A1* | 2/2006 | Yamada | B23K 26/0608 148/565 |
| 2008/0057718 | A1* | 3/2008 | Omata | H01L 27/1288 257/E21.247 |
| 2008/0076267 | A1* | 3/2008 | Oishi | G02F 1/1368 438/785 |
| 2009/0275196 | A1* | 11/2009 | Yamazaki | H01L 27/1214 257/E21.159 |
| 2010/0084744 | A1* | 4/2010 | Zafiropoulo | H01L 21/268 219/385 |
| 2010/0181295 | A1* | 7/2010 | Azdasht | B23K 3/029 228/264 |
| 2011/0192826 | A1* | 8/2011 | Von Moltke | H01L 31/0516 219/121.64 |
| 2011/0240720 | A1* | 10/2011 | Okada | H01L 24/799 228/264 |
| 2012/0061356 | A1* | 3/2012 | Fukumitsu | B23K 26/0624 219/121.61 |
| 2012/0118511 | A1* | 5/2012 | Imai | B32B 38/10 428/447 |
| 2012/0285937 | A1* | 11/2012 | Birnbaum | B23K 26/34 219/121.85 |
| 2013/0008020 | A1* | 1/2013 | Park | B23K 1/0056 29/762 |
| 2013/0075374 | A1* | 3/2013 | Mitsugi | H01L 33/0093 219/121.61 |
| 2013/0122689 | A1* | 5/2013 | Wang | H01L 25/0655 438/464 |
| 2013/0234298 | A1* | 9/2013 | Mitsugi | H01L 33/0093 257/629 |
| 2014/0097171 | A1* | 4/2014 | Wang | B23K 26/127 219/385 |
| 2014/0144593 | A1* | 5/2014 | Dang | H01L 21/02002 428/688 |
| 2014/0263208 | A1* | 9/2014 | Karlsen | B23K 26/0613 219/121.61 |
| 2015/0035173 | A1* | 2/2015 | Dang | H01L 21/302 524/375 |
| 2015/0179601 | A1* | 6/2015 | Park | B23K 1/0016 219/121.65 |
| 2015/0236280 | A1* | 8/2015 | Sakuishi | B32B 27/20 156/247 |
| 2015/0273624 | A1* | 10/2015 | Yoshida | C04B 37/026 428/209 |
| 2016/0133468 | A1* | 5/2016 | Doany | H01L 21/6835 438/795 |
| 2017/0305134 | A1* | 10/2017 | Hirakata | B32B 27/08 |
| 2018/0108874 | A1* | 4/2018 | Tanaka | B23K 26/57 |
| 2021/0005520 | A1* | 1/2021 | Ishio | H01L 21/67271 |

FOREIGN PATENT DOCUMENTS

| | | | |
|---|---|---|---|
| JP | 2004314165 A | * | 11/2004 |
| JP | 2005-85708 A | | 3/2005 |
| JP | 2017-17230 A | | 1/2017 |
| WO | WO-2011123670 A2 | * | 10/2011 ......... B23K 26/0608 |

OTHER PUBLICATIONS

Extended European Search Report dated Apr. 8, 2022, corresponding to European Application No. 20749723.1.

\* cited by examiner

MULTI-BEAM LASER DE-BONDING APPARATUS AND METHOD THEREOF

CROSS REFERENCE TO RELATED APPLICATION

This application claims the benefit of Korean Patent Application No. 10-2019-0013549 filed with the Korean Intellectual Property Office on Feb. 1, 2019, the disclosures of which are incorporated herein by reference.

TECHNICAL FIELD

Exemplary embodiments according to the present disclosure relate to a laser debonding apparatus and a method thereof, and more particularly, to a laser debonding apparatus and a method thereof that employ a multi-laser beam to address a thermal loss in a substrate caused by a single beam to thereby significantly reduce a percentage of defects of electronic components occurring during laser debonding. A laser debonding apparatus is also referred to as a rework apparatus.

BACKGROUND ART

In industrial laser processing, micron (μm) laser processing is performed in micron-level precision, which is widely used in a variety of industries such as semiconductors, displays, printed circuit boards (PCB), and smartphones, etc.

Memory chips used in all types of electronic devices had been developed to have minimal circuit intervals so as to achieve a high degree of integration and performance and high-speed communication. In recent times, however, it has become difficult to reach a desired level of technology solely by reducing circuit intervals and line intervals, and thus, memory chips tend to be vertically deposited these days. TSMC has developed a deposition technique for deposition up to 128 layers, while Samsung Electronics and SK Hynix, etc. are currently applying a technique for deposition up to 72 layers to mass production.

For displays including a mini-light emitting diode (LED) used in a backlight unit (BLU), such as liquid crystal display (LCD) TVs, and in the size of hundreds of microns (e.g., 320*180 μm), and a micro-LED used in a self-light emitting source for a digital sinage or a RGB TV and in the size of tens of microns (e.g., 100*100 μm, 40*50 μm), PCBs including with a plurality of wirings deposited thereon are employed.

In the case of defects occurring in some electronic components, such as a memory chip or an LED chip, bonded to a multi-layer PCB having a plurality of wirings, some failures may arise due to the heat emission from the laser light when debonding only the defected electronic components on the PCB having multiple electronic components disposed thereon in high density.

Figure 1:
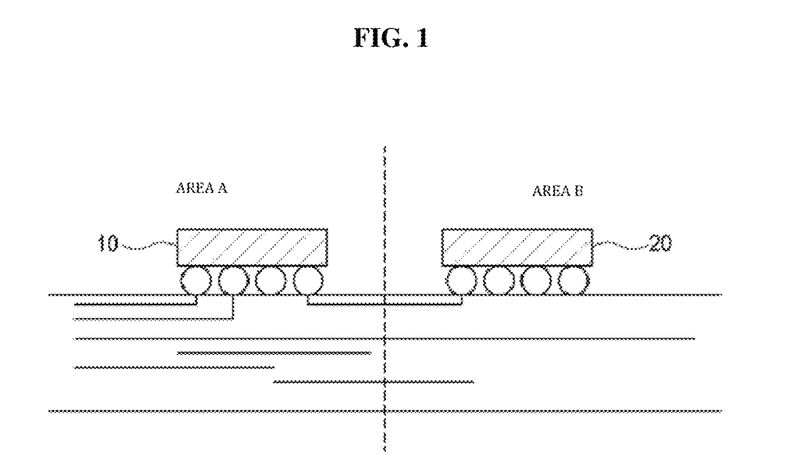
FIG. 1 is a cross-sectional view illustrating a portion of a multi-layer PCB on which electronic components are disposed.

FIG. 1 is a cross-sectional view illustrating a portion of a multi-layer PCB on which electronic components are disposed. An electronic component (10) is disposed in area A, wherein a high-density wiring layer is provided below the electronic component. An electronic component (20) is disposed in area B, wherein a low-density wiring layer is provided below the electronic component.

When emitting a laser light source with an output of 20 W, the temperature of area B drastically rises compared to area A. Specifically, while the temperature of the electronic component (10) in area A reaches an appropriate debonding level of 230 to 240° C., the electronic component (20) is overheated up to the temperature of 300° C. During the emission of a laser beam to electronic components on a substrate, if a laser beam of 1 mm or less is emitted, the energy density of the laser beam to melt the solder of the electronic components would be relatively great and a temperature deviation would be great depending on the position on the substrate. Accordingly, even though the same laser beam output conditions were applied, overheat would occur depending on the position on the substrate.

Such phenomenon is considered to arise based on the density of the wiring layer provided within the substrate in each area. While the high-density wiring layer in area A readily performs the function of discharging the heat generated from the laser light emission, the low-density wiring layer in area B does not sufficiently perform the heat discharging function.

As such, it would be difficult to learn an internal wiring structure for each position on the PCB during laser debonding. Therefore, it is inevitable to carry out laser debonding using laser light sources having the same output. In such case, although satisfactory debonding results may be gained for the electronic component (10) in area A, the electronic component (20) in area B could be overheated or even burned.

A similar phenomenon is observed on a flexible printed circuit board (FPCB) on which chips are deposited on the same surface while having different densities. That is, when emitting a laser light source to debond electronic components in a densely populated area with electronic components, electronic components coarsely disposed in a neighboring area would be overheated to a higher level.

Problem to be Solved by the Invention

The present disclosure seeks to provide a laser debonding apparatus and a method therefor capable of solving the problem of damage to electronic components and a substrate in the vicinity of a debonding site due to the energy density of a single beam in a conventional laser debonding apparatus.

The present disclosure seeks to provide a laser debonding apparatus and a method therefor capable of preventing damage or deterioration of electronic components and a substrate by reducing a temperature deviation for each position on the substrate by simultaneously or subsequently emitting a target electronic component and neighboring electronic components through the use of a multi-laser beam.

The present disclosure seeks to provide a laser debonding apparatus and a method therefor capable of conveniently fine tuning of the temperature profile of a laser beam by emitting a debonding target electronic component by using a second laser beam having a lower output than a first laser beam in a state where the electronic components in the vicinity of the debonding target are sufficiently pre-heated by using a first laser beam, compared to the case of emitting a laser beam at once using a single beam.

Means for Solving Problem

In order to achieve the aforementioned objectives, a multi-beam laser debonding apparatus for debonding an electronic component from a substrate, the apparatus includes: a first laser module to emit a first laser beam to a predetermined range of a first substrate area including attachment positions of a debonding target electronic component and a neighboring electronic component to thereby heat a solder of the electronic components to reach a predetermined pre-heat temperature; and a second laser module to emit a second laser beam overlapping the first laser beam to a second substrate area smaller than the first substrate area, the second substrate area including the attachment position of the debonding target electronic component to thereby heat the solder of the debonding target electronic component to reach a debonding temperature at which the solder commences melting.

According to an exemplary embodiment of the present disclosure, each of the first laser module and the second laser module includes at least one laser module.

According to an exemplary embodiment of the present disclosure, the first laser module and the second laser module have an emission surface having a quadrangular or circular shape.

According to an exemplary embodiment of the present disclosure, a difference between the pre-heat temperature of the first substrate area and the debonding temperature for the second substrate area is in the range of 20 to 40° C.

According to an exemplary embodiment of the present disclosure, the respective laser modules are arranged in a symmetrical manner, have an equal beam emission angle, and have different maximum outputs and different wavelengths from one another.

According to an exemplary embodiment of the present disclosure, a deviation between the pre-heat temperature of the first substrate area and the debonding temperature of the second substrate area is in the range of 10 to 15% of the maximum temperature.

According to an exemplary embodiment of the present disclosure, the first laser beam and the second laser beam are emitted simultaneously.

According to another exemplary embodiment of the present disclosure, the first laser beam and the second laser beam are emitted in sequence.

According to an exemplary embodiment of the present disclosure, a temperature profile based on the overlap between the first laser beam and the second laser beam has a dual-step increase section and a dual-step decreasing section.

According to an exemplary embodiment of the present disclosure, the multi-beam laser debonding apparatus further includes: a camera unit comprised of at least one camera module to capture a debonding process of the electronic component by the respective laser beams; and a laser output control unit to generate a control signal for independently controlling the respective laser modules of a laser emission unit based on the output signal from the camera unit to thereby apply the control signal to the laser emission unit.

Effect of the Invention

According one or more exemplary embodiments of the present disclosure, a laser debonding apparatus and a method therefor can solve the problem of damage to electronic components and a substrate in the vicinity of a debonding site due to the energy density of a single beam in a conventional laser debonding apparatus.

According one or more exemplary embodiments of the present disclosure, a laser debonding apparatus and a method therefor can prevent damage or deterioration of electronic components and a substrate by reducing a temperature deviation for each position on the substrate by simultaneously or subsequently emitting a debonding target electronic component and neighboring electronic components through the use of a multi-laser beam.

According one or more exemplary embodiments of the present disclosure, a laser debonding apparatus and a method therefor can conveniently fine tune the temperature profile of a laser beam by emitting a debonding target electronic component by using a second laser beam having a lower output than a first laser beam in a state where the electronic components in the vicinity of the debonding target are sufficiently pre-heated by using a first laser beam, compared to the case of emitting a laser beam at once using a single beam.

laser beams being emitted.

BEST MODE(S) FOR CARRYING OUT THE INVENTION

Advantages and features of the present invention and methods for achieving them will be made clear from exemplary embodiments described below in detail with reference to the accompanying drawings. The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art.

It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2A:
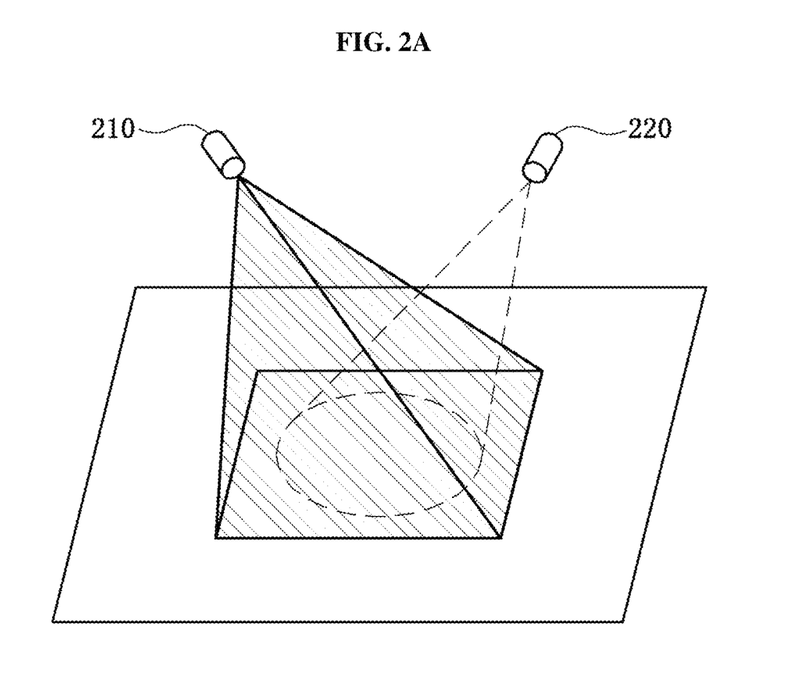
FIG. 2A is a conceptual view illustrating a dual beam module of a multi-beam laser debonding apparatus according to an exemplary embodiment of the present disclosure.
Figure 2B:
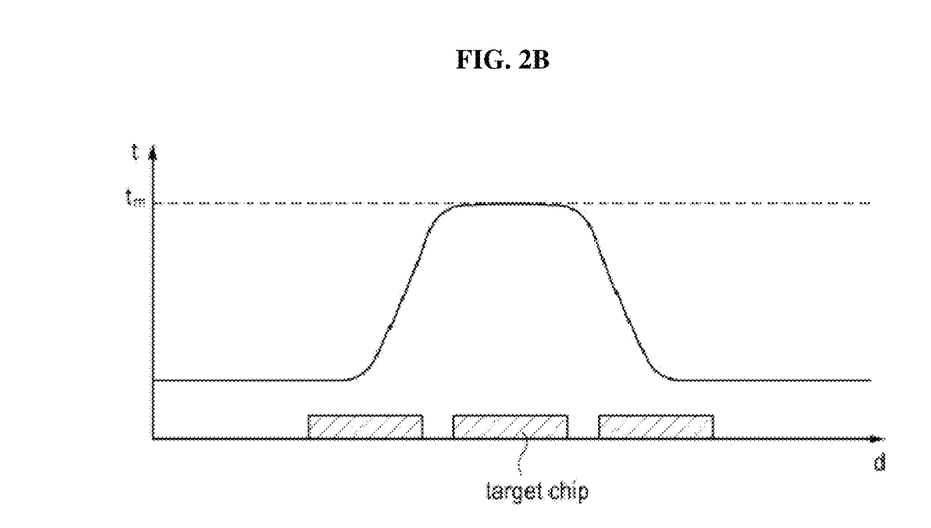
FIG. 2B is a graph illustrating a temperature profile of single laser beam emission according to related art.
Figure 2C:
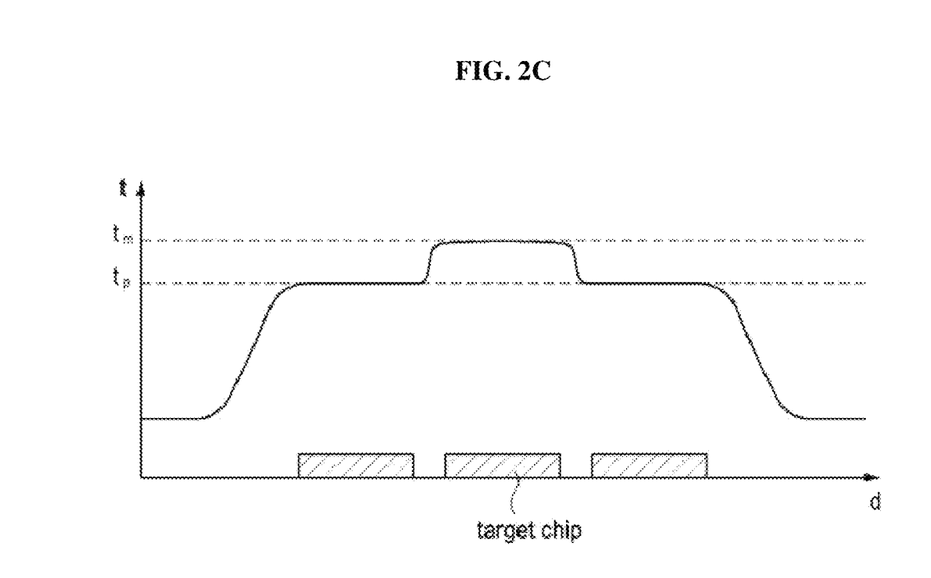
FIG. 2C is a graph illustrating a temperature profile of dual laser beam emission according to an exemplary embodiment of the present disclosure.

FIG. 2A is a conceptual view illustrating a dual beam module of a multi-beam laser debonding apparatus according to an exemplary embodiment of the present disclosure. FIG. 2B is a graph illustrating a temperature profile of single laser beam emission according to related art. FIG. 2C is a graph illustrating a temperature profile of dual laser beam emission according to an exemplary embodiment of the present disclosure.

Referring to FIG. 2A, the dual beam module includes a first laser beam module (210) to emit a first laser beam over a wide range from a debonding target electronic component ("target chip") to a neighboring area and a second laser beam module (220) to emit a second laser beam only to an attachment position of the target chip, wherein the superposition of the first and second laser beams occurs at the attachment position of the target chip.

While FIG. 2A illustrates the first laser beam as having a quadrangular shape and the second laser beam as having a circular shape, both laser beams may have a quadrangular shape. The first and second laser beams may be simultaneously emitted. Alternatively, the second laser beam may be emitted subsequently to pre-heating a substrate by the first laser beam.

FIGS. 2B and 2C are graphs comparing temperature profiles of single laser beam emission according to related art and dual laser beam emission according to an exemplary embodiment of the present disclosure.

Referring to FIG. 2B, a single laser beam with an output of 20 W is emitted to a target chip to heat it to a predetermined debonding temperature (tm) at which a solder is melted. In this instance, the heat is transmitted to electronic components in the vicinity of the target chip.

Referring to FIG. 2C, however, the temperature profile of the first laser beam by the first laser beam module (210), for example, with an output of 15 W, shows an increase in the temperature of a substrate in a predetermined area including the target chip and a neighboring region only to a predetermined pre-heat temperature (tp), which is lower than the melting point of the solder. The pre-heat temperature (tp) needs to be maintained at a low level so as not to damage the electronic components in an area of the substrate where heat dissipation is not sufficiently provided.

The temperature profile of the second laser beam by the second laser beam module (220), for example, with an output of 5 W, shows an increase in the temperature of the substrate and electronic components only within an attachment area of the target chip (or up to a nearest neighboring area to the target chip). Accordingly, a sufficient source of heat needed for debonding may be supplied only to the target chip without damaging the electronic components in other areas of the substrate.

Figure 3:
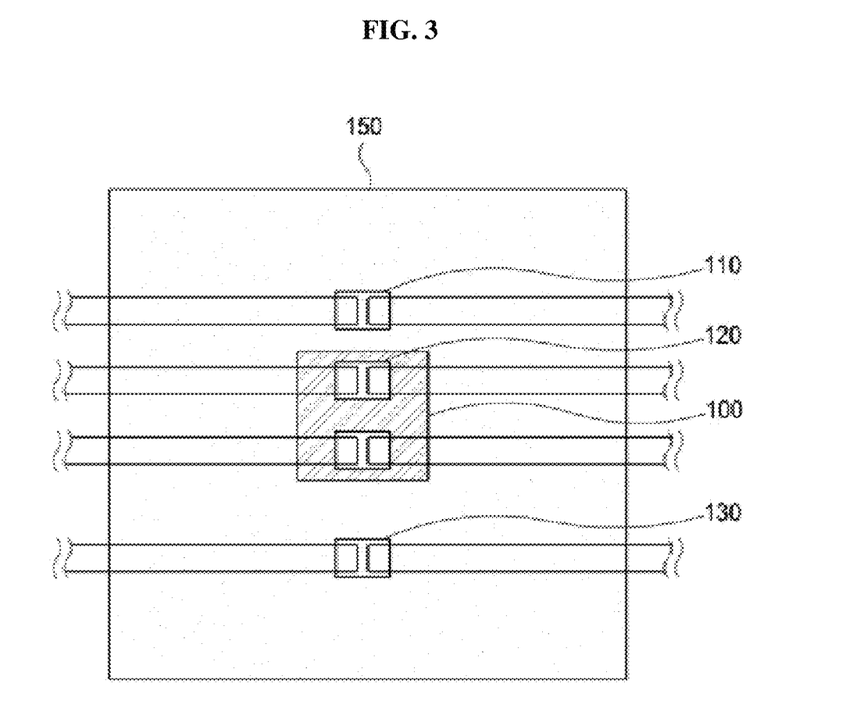
FIG. 3 is a view illustrating a process of emitting a multi-laser beam according to an exemplary embodiment of the present disclosure to an FPCB on which electronic components are disposed.

FIG. 3 is a view illustrating a process of emitting a multi-laser beam according to an exemplary embodiment of the present disclosure to an FPCB on which electronic components are disposed.

The first laser beam module (210) emits a first laser beam to an FPCB having a plurality of electronic components (110, 120, 130) disposed thereon. While maintaining the temperature of a first laser beam emission area (150) to a predetermined level of pre-heat temperature (tp), for example, 225° C., which is lower than the melting point of the solder, the second laser beam module (220) emits a second laser beam to increase the temperature of the substrate and the electronic components in only an attachment area (100) of the target chip (or up to a nearest neighboring area to the target chi) to a level of debonding temperature (tm), for example, 250° C., to thereby induce the melting of the solder only in the attachment area of the target chip.

In this instance, it is preferable to simultaneously perform the emission of the first and second laser beams in order to lesion the process time.

Figure 4A:
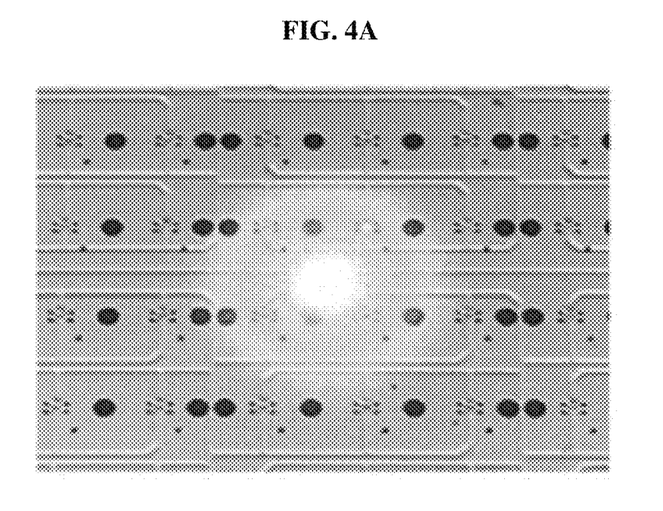
FIGS. 4A and 4B are images comparing FPCBs, to one of which a single laser beam according to related art is emitted and to the other a dual laser beam is emitted by a multi-laser debonding apparatus according to an exemplary embodiment of the present disclosure.
Figure 4B:
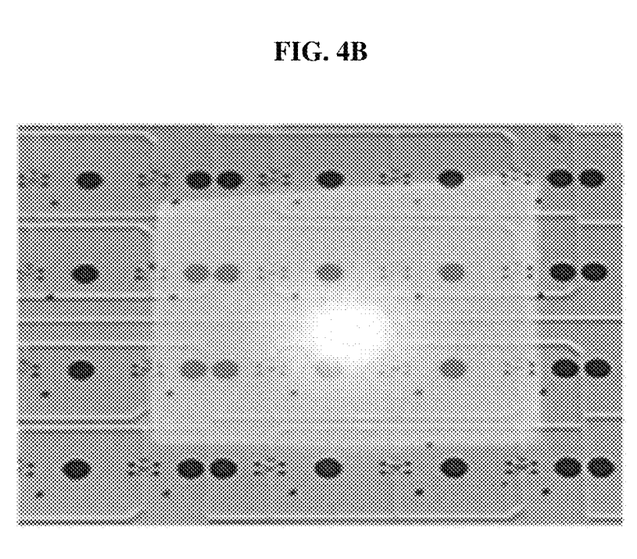

FIGS. 4A and 4B are images comparing FPCBs, to one of which a single laser beam according to related art is emitted and to the other a dual laser beam is emitted by a multi-laser debonding apparatus according to an exemplary embodiment of the present disclosure.

Referring to FIG. 4A, a single laser beam having a circular emission surface is emitted to a target chip. Referring to FIG. 4B, a first laser beam having a quadrangular emission surface increases the temperature in a predetermined area of a substrate including a target chip, while a second laser beam is emitted only to an attachment area of the target chip.

Figure 5A:
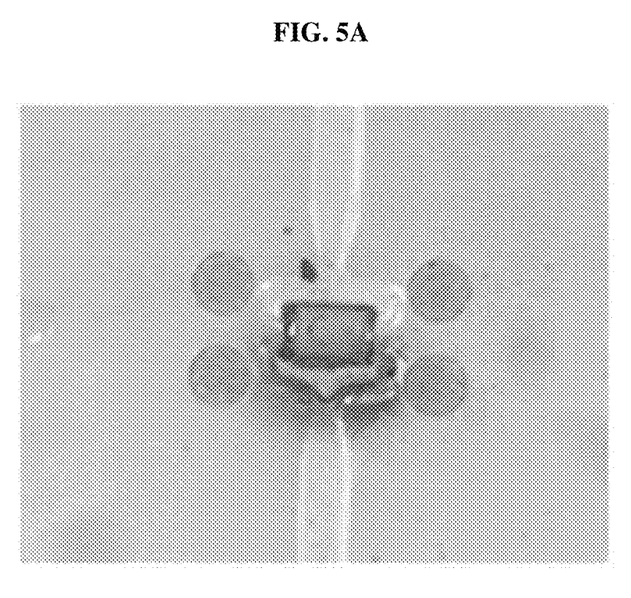
FIGS. 5A and 5B are images comparing a state of an electronic component disposed on an FPCB to which a single laser beam according to related art has been emitted and a state of an electronic component disposed on an FPCB to which a dual laser beam has been emitted by a multi-laser debonding apparatus according to an exemplary embodiment of the present disclosure.
Figure 5B:
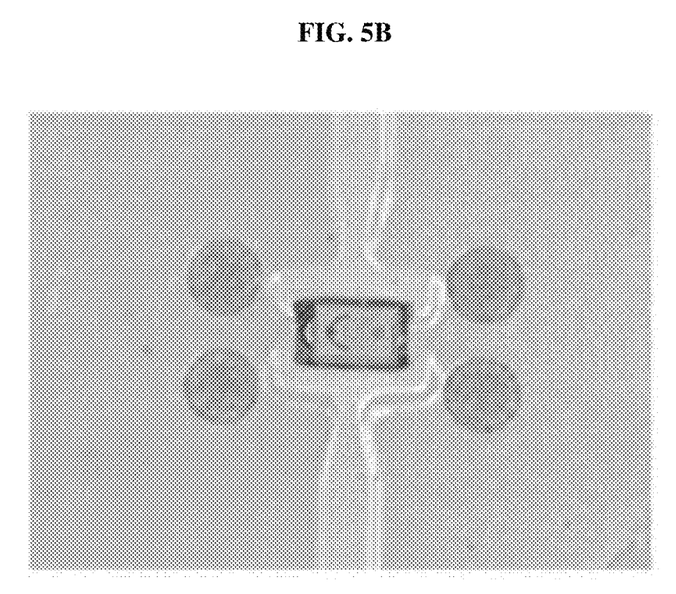

FIGS. 5A and 5B are images comparing a state of an electronic component disposed on an FPCB to which a single laser beam according to related art has been emitted and a state of an electronic component disposed on an FPCB to which a dual laser beam has been emitted by a multi-laser debonding apparatus according to an exemplary embodiment of the present disclosure. Referring to FIG. 5A, it is shown that the electronic component has been damaged. Referring to FIG. 5B, there is no damage to the electronic component.

Figure 6:
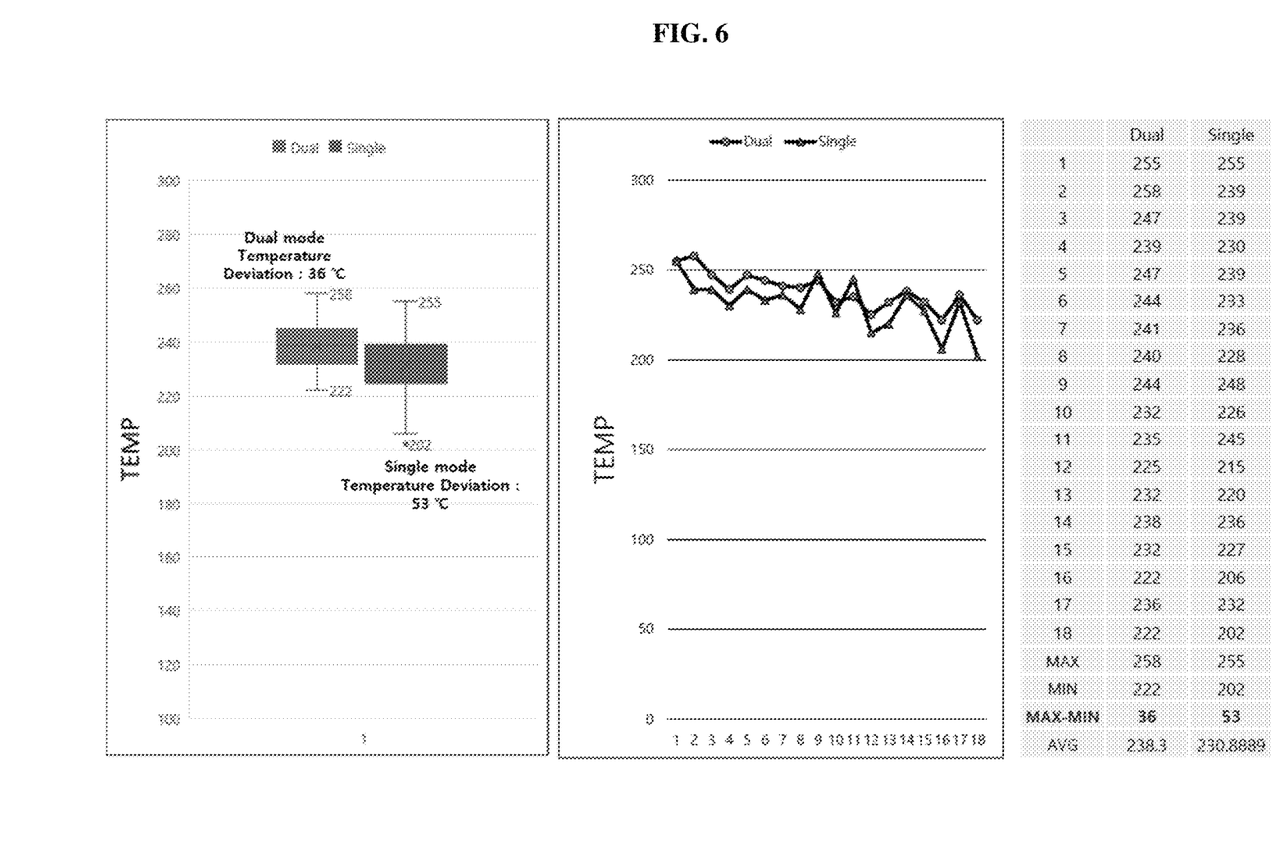
FIG. 6 is graphs showing the results of temperature deviation test during the emission of a single laser beam according to related art and a dual laser beam according to an exemplary embodiment of the present disclosure to an FPCB having the thickness of 0.08 mm.

FIG. 6 is a graph showing the results of temperature deviation test during the emission of a single laser beam according to related art and a dual laser beam according to an exemplary embodiment of the present disclosure to an FPCB having the thickness of 0.08 mm.

Referring to FIG. 6, the graph shows the test results of measuring the temperatures on 18 points on a laser beam emission surface of a substrate (thickness of 0.08 mm based on the FPCB) to which a dual laser beam is emitted (indicated by "Dual") and a single laser beam according to related art is emitted (indicated by "Single").

In the test, a temperature distribution of the single laser beam according to related art is in the range of 202 to 255° C., showing a temperature deviation of 53° C., while a temperature distribution of the dual laser beam according to an exemplary embodiment of the present disclosure is in the range of 222 to 258° C., showing a temperature deviation of 36° C.

While the two laser beams are identical in that the overall temperature decreases from the center position (1) of the target chip to the edge position (18) of the laser beam emission surface, a temperature deviation between the maximum temperature and the minimum temperature of the dual laser beam is 17° C. less than a temperature deviation of the single laser beam. The minimum temperature of the dual laser beam is approximately 86% of the maximum temperature, resulting in a deviation of approximately 12%. The minimum temperature of the single laser beam is approximately 79% of the maximum temperature, resulting in a deviation of approximately 21%.

Figure 7:
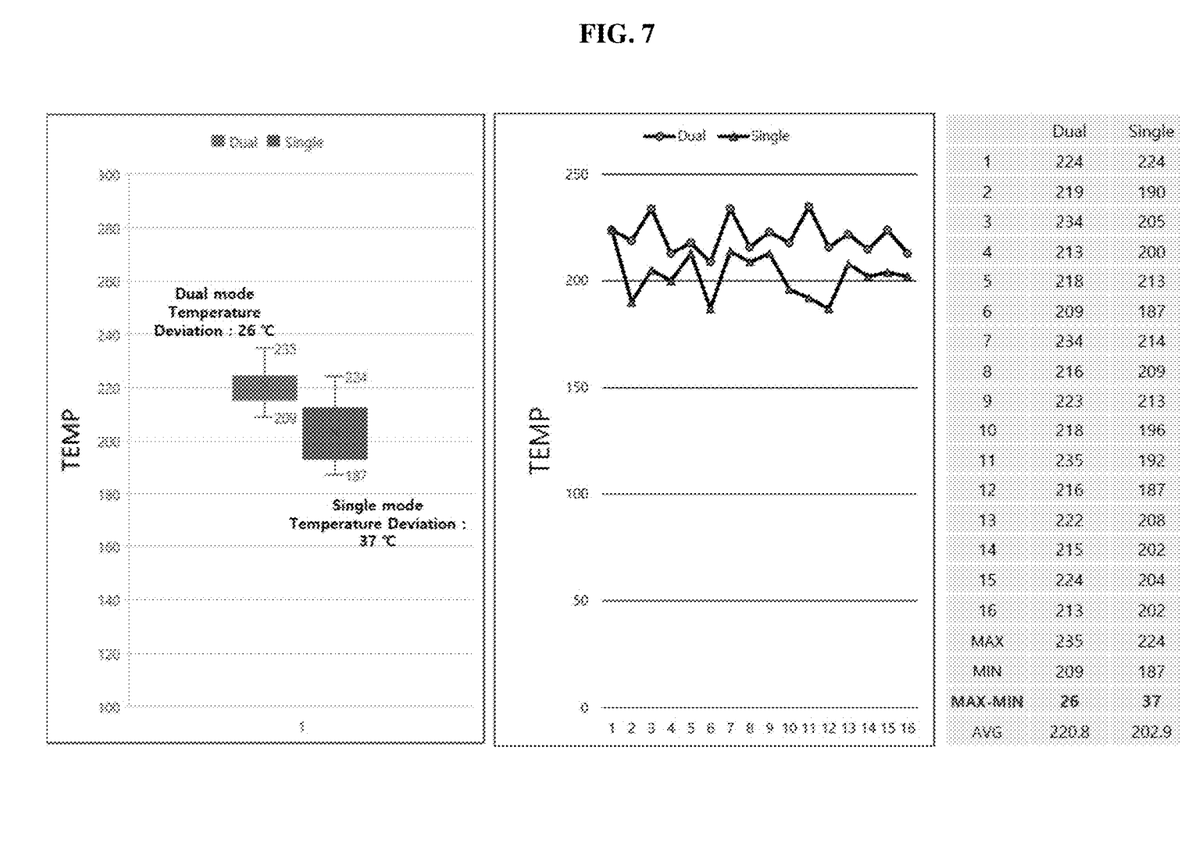
FIG. 7 is graphs showing the results of temperature deviation test during the emission of a single laser beam according to related art and a dual laser beam according to an exemplary embodiment of the present disclosure to a rigid FPCB having the thickness of 0.6 mm.

FIG. 7 is graphs showing the results of temperature deviation test during the emission of a single laser beam according to related art and a dual laser beam according to an exemplary embodiment of the present disclosure to a rigid FPCB having the thickness of 0.6 mm.

Referring to FIG. 7, the graph shows the test results of measuring the temperatures on 16 points on a laser beam emission surface of a substrate to which a dual laser beam is emitted (thickness of 0.6 mm based on the rigid FPCB) (indicated by "Dual") and a single laser beam according to related art is emitted (indicated by "Single").

In the test, a temperature distribution of the single laser beam according to related art is in the range of 187 to 224° C., showing a temperature deviation of 37° C., while a temperature distribution of the dual laser beam according to an exemplary embodiment of the present disclosure is in the range of 209 to 235° C., showing a temperature deviation of 26° C.

While the two laser beams are identical in that the overall temperature decreases from the center position (1) of the target chip to the edge position (16) of the laser beam emission surface, a temperature deviation between the maximum temperature and the minimum temperature of the dual laser beam is 11° C. less than a temperature deviation of the single laser beam. The minimum temperature of the dual laser beam is approximately 89% of the maximum temperature, resulting in a deviation of approximately 11%. The minimum temperature of the single laser beam is approximately 83% of the maximum temperature, resulting in a deviation of approximately 27%.

Although not illustrated, in the case of a test using a different type of PCB, a temperature deviation between the pre-heat temperature of the first substrate area and the debonding temperature of the second substrate area is in the range of 20 to 40° C. (based on the debonding temperature of approximately 250° C.). If a maximum deviation of the pre-heat temperature of the first substrate area and the debonding temperature of the second substrate area is maintained in the range of 10 to 15% of the maximum temperature, excellent debonding results can be obtained.

Figure 8:
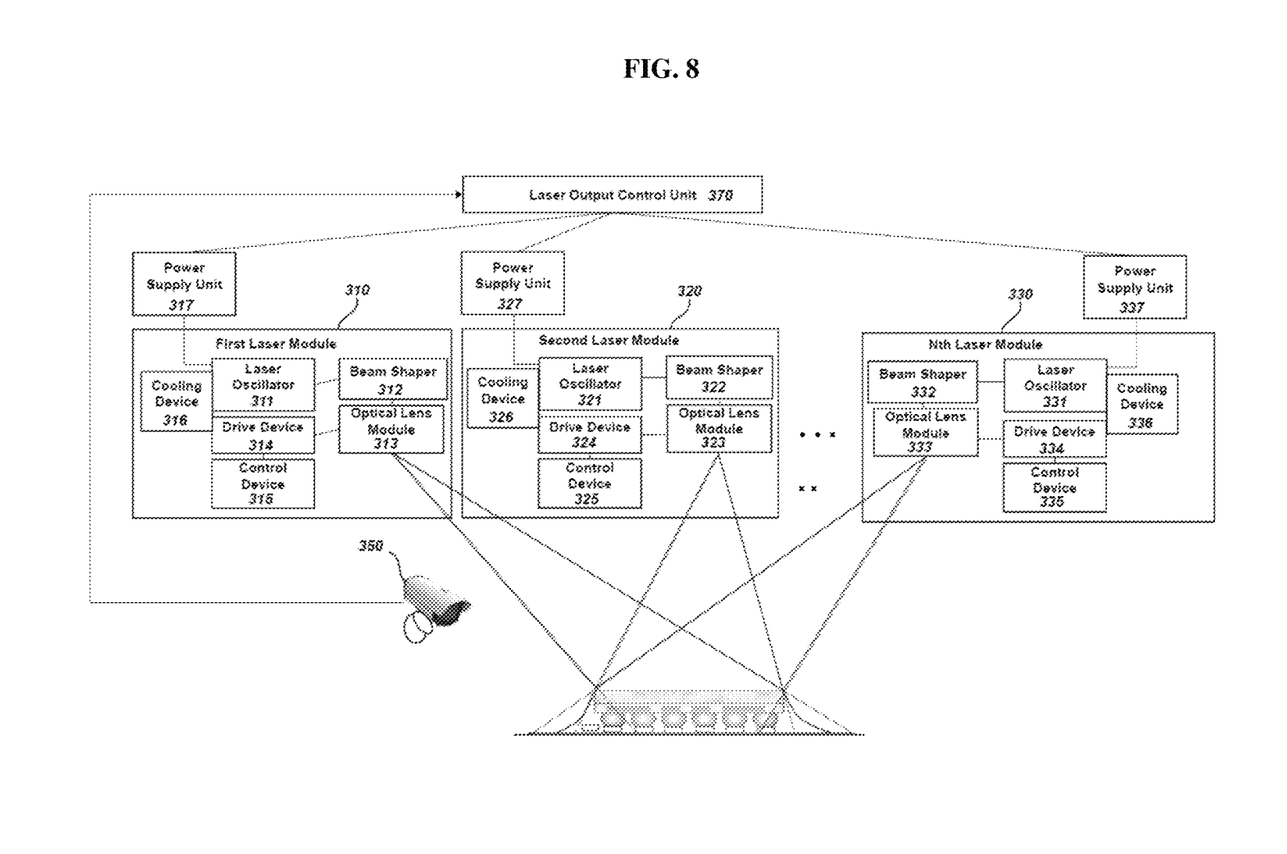
FIG. 8 is a configurational view illustrating a multi-beam laser apparatus according to an exemplary embodiment of the present disclosure.

FIG. 8 is a configurational view illustrating a multi-beam laser apparatus according to an exemplary embodiment of the present disclosure.

Referring to FIG. 8, laser modules (310, 320, . . . 330) of a laser emission unit include laser oscillators (311, 321, 331) provided with cooling devices (316, 326, 336), beam shapers (312, 322, 332), optical lens modules (313, 323, 333), drive devices (314, 424, 334), control devices (315, 325, 335) and power supply units (317, 327, 337), respectively.

Hereinafter, descriptions of the first laser module (310) will be provided to avoid an overlap between the respective laser modules, which include identical features, except where necessary.

The laser oscillator (311) is configured to generate a laser beam having a predetermined wavelength and output power. The laser oscillator may include, for example, a laser diode (LD) having a wavelength in the range of 750 nm to 1,200 nm, 1,400 nm to 1,600 nm, 1,800 nm to 2,200 nm, or 2,500 nm to 3,200 nm, a rare-earth-doped fiber laser or a rare-earth-doped crystal laser), or a medium for emitting an Alexandrite laser light having a wavelength of 755 nm, or a medium for emitting an (Nd:YAG) laser light having a wavelength of 1064 nm or 1320 nm.

The beam shaper (312) is configured to convert the laser having a spot shape which is generated from the laser oscillator and transmitted through an optical fiber to an area beam having a flat top. The beam shaper (312) may include a square light pipe, a diffractive optical element (DOE) or a micro-lens array (MLA).

The optical lens module (313) is configured to adjust the shape and size of the laser converted to an area beam by the beam shaper so as to emit the converted laser to an electronic component mounted on a PCB or to an emission zone. The optical lens module constitutes an optical system comprised of a plurality of lenses. Detailed descriptions of the optical system will be provided below with reference to FIGS. 9 to 12.

The drive device (314) is configured to adjust the distance and the position of the laser module with respect to an emission surface. The control device (315) is configured to control the drive device (314) to thereby adjust a beam shape, a beam area size, a beam sharpness, and a beam emission angle at the time of the laser beam arriving at the emission surface. The control device (315) may collectively control the operations of the respective units of the laser module (310), apart from the operation of the drive device (314).

The laser output control unit (370) is configured to control the amount of power supplied to the respective laser modules (310, 320, 330) from the corresponding power supply units (317, 327, 337) based on the program received through a user interface or a predetermined program. The laser output control unit (370) receives information on the debonding state for each component or each zone on the emission surface, or for the entire emission surface from at least one camera module (350) to control the respective power supply units (317, 327, 337) based on the information. Alternatively, the control information from the laser output control unit (370) may be transmitted to the control devices (315, 325, 335) of the respective laser modules (310, 320, 330), and the control devices (315, 325, 335) may provide feedback signals for controlling the corresponding power supply units (317). Moreover, unlike the example shown in FIG. 8, power may be distributed to the respective laser modules through a single power supply unit. In such case, the laser output control unit (370) controls the power supply unit.

In a laser superposition mode using a multi-beam, the laser output control unit (370) controls the respective laser modules and the power supply units (317, 327, 337) so that the laser beams from the respective laser modules (310, 320, 330) have a beam shape, beam area size, beam sharpness and beam emission angle as needed. Apart from pre-heating as wide as a surrounding area of a debonding target using the first laser module (310), and additionally heating a relatively smaller area corresponding to the debonding target using the second laser module (320), the laser superposition mode may also be used to control the respective laser modules to have a temperature profile as needed by appropriately assigning the pre-heating function and the additional heating function among the first, second and third laser modules (310, 320, . . . 330).

In the case of splitting a single laser light source to input it in the respective laser modules, the laser output control unit (370) may serve the function of simultaneously adjusting the output and the phase of the respective split laser beams. In such case, the phase may be controlled to induce an offset interference between the respective laser beams to thereby enhance beam flatness, which in turn significantly increases energy efficiency.

In a simultaneous multi-location process mode, the laser output control unit (370) controls at least one of a beam shape, beam area size, beam sharpness, beam emission angle, and beam wavelength so that some or all of the laser beams from the respective laser modules are different. Also, in the case of splitting a single laser light source and inputting it to the respective laser modules, the laser output control unit (370) may serve the function of simultaneously adjusting the output and the phase of the respective split laser beams.

With this function, the surface area and the output of the laser beam can be adjusted to thereby create bonding between electronic components on an emission surface and a substrate or to remove the bonding. Specifically, in the case of removing damaged electronic components from the substrate, the area of a laser beam may be minimized to the region of the corresponding electronic component, to thereby significantly reduce the heat from the laser beam being applied to other neighboring components or normal components on the substrate, so that only the target object, i.e., damaged electronic components, may be removed.

In the case of a plurality of laser modules emitting laser beams having different wavelengths, the laser emission unit may include individual laser modules having a wavelength that can be readily absorbed by each of a plurality of constituent layers (e.g., EMC layer, silicon layer, solder layer) included in an electronic component. Accordingly, the laser debonding apparats according to an exemplary embodiment of the present disclosure may perform an optimized process for attaching or bonding or detaching or debonding by differently increasing the temperature of an electronic component and the temperature of an intermediate bonding member, such as a solder, for connecting between a PCT and the electronic component in a selective manner. Specifically, all the energy of the respective laser beams may be absorbed by the solder layer by allowing the energy to transmit an EMC mold layer and a silicon layer, or by heating the surface of the electronic component without allowing the laser beam to transmit the EMC mold layer to thereby transfer the heat to the bonding area in a lower portion of the electronic component.

Using such function, a predetermined region of the substrate including the area of the target chip and its neighboring area are pre-heated up to a predetermined pre-heat temperature, and then the temperature of the target chip is selectively heated to a debonding temperature at which the melting of the solder occurs by at least one second laser beam, thereby allowing the target chip to be selectively removed. Subsequently, the target chip may be removed from the substrate by an ejector (not shown) having a predetermined shape.

FIGS. 9 to 12 are configurational views illustrating a laser optical system applicable to a multi-beam laser debonding apparatus according to an exemplary embodiment of the present disclosure.

Figure 9:
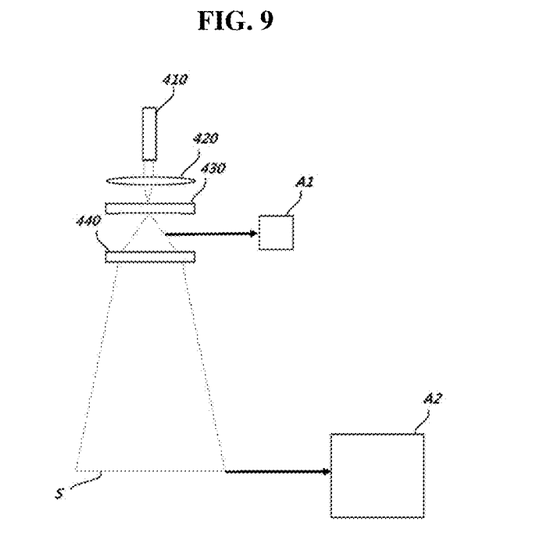
FIGS. 9 to 12 are configurational views illustrating a laser optical system applicable to a multi-beam laser debonding apparatus according to an exemplary embodiment of the present disclosure.

FIG. 9 illustrates a simplest example of an optical system applicable to an exemplary embodiment of the present disclosure. When a laser beam emitted from a beam transmitting optical fiber (410) is focus-aligned by a convex lens (420) to be incident to a beam shaper (430), the beam shaper (430) converts the laser beam having a spot shape to an area beam (A1) having a flat top. The area beam (A1) having a square shape output from the beam shaper (430) is expanded to have a desired size by a concave lens (440) and is emitted to an imaging surface (S) as an expanded area beam (A2).

Figure 10:
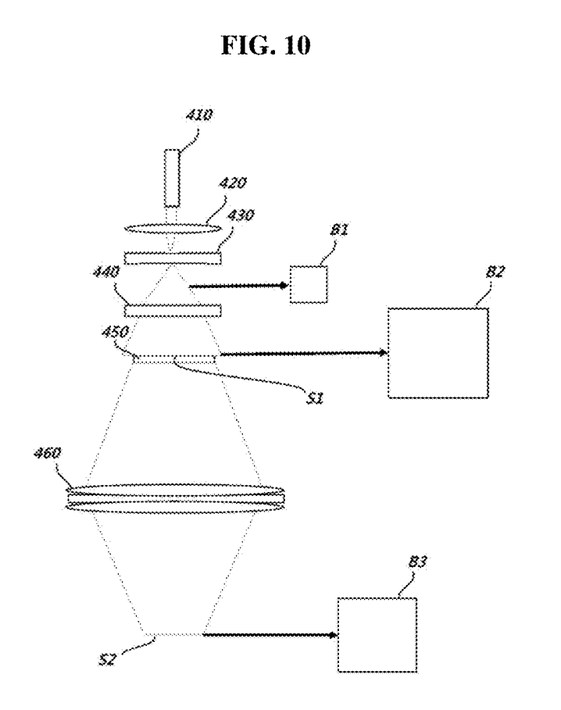

FIG. 10 illustrates an example of an optical system according to another exemplary embodiment of the present disclosure.

An area beam (B1) output from a beam shaper (430) is expanded by a concave lens (440) to have a predetermined size and is emitted to a first imaging surface (S1) as an area beam (B2). In the case of additionally expanding the area beam (B2), an edge of the area beam (B2) may be blurred by the additional expansion. To achieve the emission of light having a sharp edge in a final emission surface even in a second imaging surface (S2), the edge of the first imaging surface (S1) is trimmed by a mask (450).

The area beam that has transmitted through the mask (450) is transmitted through a zoom lens module (460) comprised of one or more of a convex lens and a concave lens to be diminished (or expanded) to a desired size, to thereby form a square emission light (B3) on the second image surface (S2) on which an electronic component is disposed.

Figure 11:
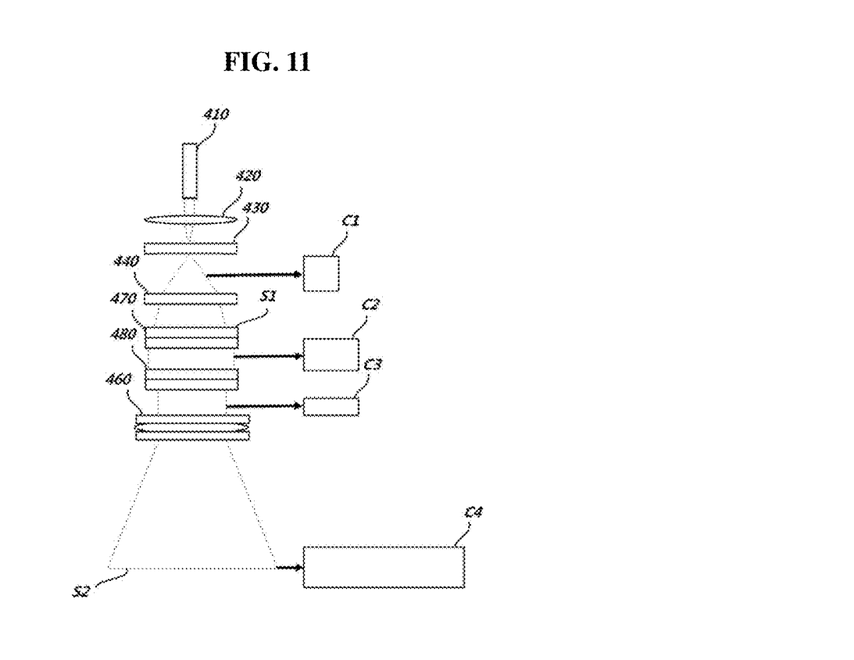

FIG. 11 illustrates an example of an optical system applicable to still another exemplary embodiment of the present disclosure.

A square area beam (C1) output from a beam shaper (430) is expanded by a concave lens (440) to have a predetermined size and is transmitted through at least one pair of cylindrical lenses (470) to be expanded (or diminished) in, for example, X axis direction. Further, the square area beam (C1) is transmitted through at least one pair of cylindrical lenses (480) to be diminished (or expanded) in, for example, Y axis direction, to be converted to an area beam (C3) having a rectangular shape.

The cylindrical lens, having a shape cut in the longitudinal direction of a cylinder, serves to expand or diminish the laser beam according to the form of the respective lenses arranged in a vertical direction. The laser beam is adjusted in X or Y axis direction depending on the form of the cylindrical lenses arranged on the surface in X or Y axis direction.

The area beam (C3) is transmitted through the zoom lens module (460) comprised of one of more or a convex lens and a concave lens to be expanded (or diminished) to have a desired shape, to form an emission light (C4) having a rectangular shape on a second imaging surface (S2) on which the electronic component is disposed.

Figure 12:
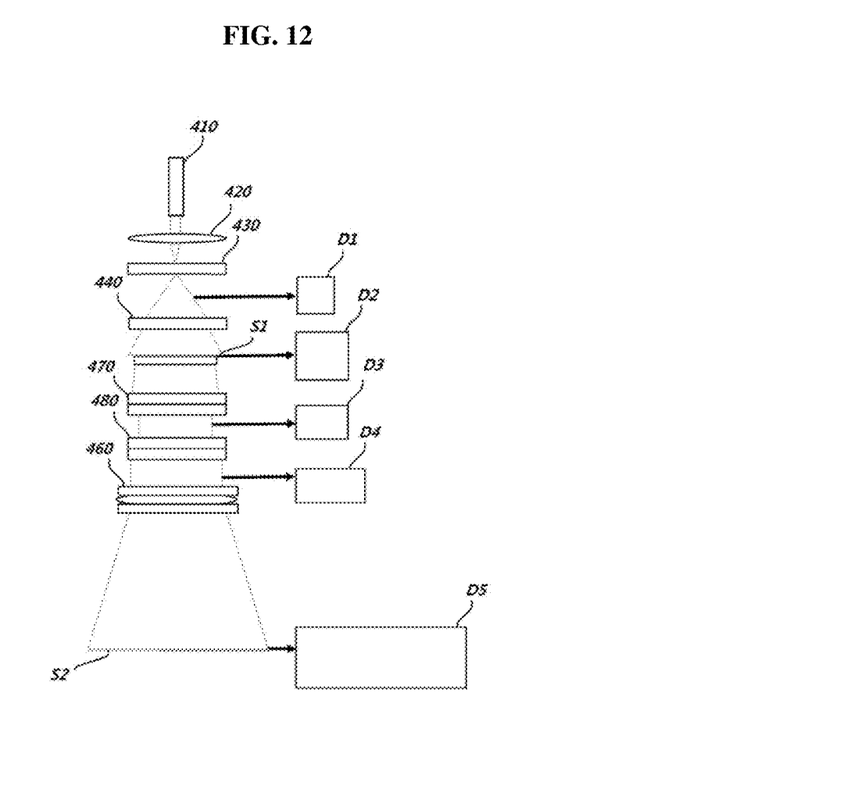

FIG. 12 illustrates an example of an optical system applicable to a further another exemplary embodiment of the present disclosure.

The optical system of FIG. 12 further includes the feature of trimming an edge of a laser beam in addition to the optical system of FIG. 11. Compared to the example of FIG. 11, the optical system of FIG. 12 may obtain a final area beam (D5) with a sharp edge.

Although exemplary embodiments of the present disclosure have been shown and described with reference to the accompanied drawings, the present invention is not limited to the described embodiments. Instead, it would be appreciated by those skilled in the art that changes may be made to these embodiments without departing from the principles and spirit of the invention, the scope of which is defined by the claims and their equivalents.

DRAWING REFERENCE NUMERALS

310: FIRST LASER MODULE
320: SECOND LASER MODULE

316, 326: COOLING DEVICE
311, 321: LASER OSCILLATOR
313, 323: OPTICAL LENS MODULE
314, 424: DRIVE DEVICE
315, 325: CONTROL DEVICE
317, 327: POWER SUPPLY UNIT

The invention claimed is:

1. A multi-beam laser debonding apparatus for debonding a target electronic component from a substrate, the apparatus comprising:
   a first laser module configured to
      emit a first laser beam to a first substrate area including attachment positions of the target electronic component and a neighboring electronic component around the target electronic component, and
      heat solders of the target electronic component and the neighboring electronic component within the first substrate area to reach a predetermined pre-heat temperature; and
   a second laser module configured to
      emit a second laser beam to a second substrate area smaller than the first substrate area to overlap the first laser beam, the second substrate area including only the attachment position of the target electronic component, and
      heat the solder of the target electronic component to reach, from the preheated temperature, a debonding temperature at which the solder commences melting,
   wherein the output power of the second laser beam is lower than the output power of the first laser beam, and
   wherein the first laser module and the second laser module have an emission surface having a quadrangular, and wherein the first and second laser modules are arranged in a symmetrical manner, have an equal beam emission angle, and have different wavelengths from one another.

2. The multi-beam laser debonding apparatus according to claim 1, wherein a difference between the pre-heat temperature of the first substrate area and the debonding temperature for the second substrate area is in the range of 20 to 40° C.

3. The multi-beam laser debonding apparatus according to claim 1, wherein a deviation between the pre-heat temperature of the first substrate area and the debonding temperature of the second substrate area is in the range of 10 to 15% of the maximum debonding temperature.

4. The multi-beam laser debonding apparatus according to claim 1, wherein the first laser beam and the second laser beam are emitted simultaneously.

5. The multi-beam laser debonding apparatus according to claim 1, wherein the first laser beam and the second laser beam are emitted in sequence.

6. The multi-beam laser debonding apparatus according to claim 1, wherein a temperature profile based on the overlap between the first laser beam and the second laser beam has a two-step increase section.

7. The multi-beam laser debonding apparatus according to claim 1, the apparatus further comprising:
   a camera unit having at least one camera module and configured to capture a debonding process by the first and second laser beams and output a captured signal; and
   a laser output control unit configured to generate a control signal for independently controlling the first and second laser modules based on the captured signal from the camera unit and apply the control signal to the first and second laser modules.

* * * * *